(12) United States Patent
Shirasaki et al.

(10) Patent No.: US 11,862,930 B2
(45) Date of Patent: Jan. 2, 2024

(54) OPTICAL MODULE HAVING RESTRICTION BODY FIXED TO STEM AND HAVING A LINEAR THERMAL EXPANSION COEFFICIENT SMALLER THAN THAT OF THE STEM

(71) Applicant: Mitsubishi Electric Corporation, Tokyo (JP)

(72) Inventors: Akio Shirasaki, Tokyo (JP); Tatsuki Otani, Tokyo (JP); Norio Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 467 days.

(21) Appl. No.: 16/771,153

(22) PCT Filed: Feb. 9, 2018

(86) PCT No.: PCT/JP2018/004583
§ 371 (c)(1),
(2) Date: Jun. 9, 2020

(87) PCT Pub. No.: WO2019/155602
PCT Pub. Date: Aug. 15, 2019

(65) Prior Publication Data
US 2021/0184424 A1     Jun. 17, 2021

(51) Int. Cl.
*H01S 5/02326*     (2021.01)
*H01S 5/02253*     (2021.01)
(Continued)

(52) U.S. Cl.
CPC .......... *H01S 5/02326* (2021.01); *H01S 5/024* (2013.01); *H01S 5/0231* (2021.01);
(Continued)

(58) Field of Classification Search
CPC ............ H01S 5/02415; H01S 5/02212; H01S 5/02253; H01S 5/0231; H01S 5/024;
(Continued)

(56) References Cited

U.S. PATENT DOCUMENTS

| 4,803,361 A | * | 2/1989 | Aiki ..................... G02B 6/4204 |
| | | | 250/227.24 |
| 5,924,290 A | * | 7/1999 | Yoshino ............... G02B 6/4272 |
| | | | 165/185 |

(Continued)

FOREIGN PATENT DOCUMENTS

| CN | 107045167 A | 8/2017 |
| JP | H05-055609 A | 3/1993 |

(Continued)

OTHER PUBLICATIONS

International Search Report; Written Opinion; and Notification of Transmittal of the International Search Report and the Written Opinion of the International Searching Authority, or the Declaration issued in PCT/JP2018/004583; dated Apr. 17, 2018.

(Continued)

*Primary Examiner* — M. A. Golub-Miller
(74) *Attorney, Agent, or Firm* — Studebaker & Brackett PC

(57) ABSTRACT

An optical module includes: a stem including a first surface and a second surface opposite to the first surface; a thermoelectric cooler including a heat-releasing substrate fixed to the first surface; a semiconductor laser element attached to the thermoelectric cooler; a cap fixed to the first surface and covering the thermoelectric cooler and the semiconductor laser element; a lens fixed to the cap; and a restriction body fixed to the second surface. The linear thermal expansion (Continued)

coefficients of the heat-releasing substrate and the restriction body are smaller than the linear thermal expansion coefficient of the stem.

3 Claims, 7 Drawing Sheets

(51) Int. Cl.
*H01S 5/02212* (2021.01)
*H01S 5/0231* (2021.01)
*H01S 5/0239* (2021.01)
*H01S 5/024* (2006.01)
*H01S 5/02251* (2021.01)

(52) U.S. Cl.
CPC ........ *H01S 5/0239* (2021.01); *H01S 5/02212* (2013.01); *H01S 5/02253* (2021.01); *H01S 5/02251* (2021.01); *H01S 5/02415* (2013.01); *H01S 5/02469* (2013.01)

(58) Field of Classification Search
CPC ............... H01S 5/02326; H01S 5/0239; H01S 5/02251; H01S 5/02469
See application file for complete search history.

(56) References Cited

U.S. PATENT DOCUMENTS

| 9,625,671 | B2* | 4/2017 | Vorndran | G02B 27/30 |
|---|---|---|---|---|
| 2003/0043868 | A1* | 3/2003 | Stewart | H01S 5/02212 372/36 |
| 2007/0091945 | A1* | 4/2007 | Ferstl | H01S 5/02216 372/38.1 |
| 2007/0153848 | A1* | 7/2007 | Fratti | G11B 33/1406 |
| 2008/0037601 | A1* | 2/2008 | Nielsen | H01S 5/02325 372/34 |
| 2011/0026558 | A1* | 2/2011 | Raju | G02B 6/423 372/50.1 |
| 2012/0051382 | A1* | 3/2012 | Miao | H01S 5/02212 372/50.1 |
| 2012/0269508 | A1* | 10/2012 | Komiyama | H04B 10/564 398/201 |
| 2014/0161391 | A1 | 6/2014 | Ohata et al. | |
| 2015/0098480 | A1* | 4/2015 | Matsuyama | H01S 5/02325 372/34 |
| 2017/0227722 | A1 | 8/2017 | Shirasaki et al. | |
| 2019/0089126 | A1* | 3/2019 | Guichard | H01S 5/02212 |
| 2021/0389548 | A1* | 12/2021 | Schweitzer | G02B 7/028 |

FOREIGN PATENT DOCUMENTS

| JP | 2006-080418 | A | 3/2006 |
|---|---|---|---|
| JP | 2007-208065 | A | 8/2007 |
| JP | 2011-108937 | A | 6/2011 |
| JP | 2014-132627 | A | 7/2014 |
| JP | 2015-106577 | A | 6/2015 |
| JP | 2017-139416 | A | 8/2017 |

OTHER PUBLICATIONS

Office Action issued in JP 2018-529080; mailed by the Japanese Patent Office dated Aug. 14, 2018.
Office Action issued in JP 2018-529080; mailed by the Japanese Patent Office dated Dec. 11, 2018.
Office Action issued in JP 2018-529080; mailed by the Japanese Patent Office dated Mar. 28, 2019.
Office Action issued in JP 2019-013884; mailed by the Japanese Patent Office dated Jan. 21, 2020.
Office Action issued in TW 107112569; mailed by the Taiwan Intellectual Property Office dated Mar. 16, 2020.
An Office Action mailed by China National Intellectual Property Administration dated Nov. 23, 2021 which corresponds to Chinese Patent Application No. 201880088591.9 and is related to U.S. Appl. No. 16/771,153 with English language translation.
An Office Action mailed by Taiwanese Patent Office dated Jun. 24, 2021, which corresponds to Taiwanese Patent Application No. 107112569 and is related to U.S. Appl. No. 16/771,153; with English language translation.
An Office Action mailed by Taiwanese Patent Office dated Jan. 7, 2021, which corresponds to Taiwanese Patent Application No. 107112569 and is related to U.S. Appl. No. 16/771,153; with English language translation.

* cited by examiner

LEAD PIN OUTPUT SIDE
(with restriction body) ←→ TEC SIDE
(without restriction body)

OPTICAL MODULE HAVING RESTRICTION BODY FIXED TO STEM AND HAVING A LINEAR THERMAL EXPANSION COEFFICIENT SMALLER THAN THAT OF THE STEM

FIELD

The present invention relates to an optical module.

BACKGROUND

Recently, optical modules compatible with a transmission distance of 40 km to 80 km at a transmission speed of 10 Gbit/s have become widely available, and reduction of their cost has been increasingly requested. Such an optical module includes a semiconductor laser on which electroabsorption modulators are integrated and that can transmit high-quality optical signals, and a Peltier element configured to control the temperature of the semiconductor laser to be constant to stabilize characteristics. Conventionally, a ceramic box-shaped package has been used as an optical module package, but recently, a transistor outlined CAN (TO-CAN) package, which is more inexpensive, has been increasingly used.

The TO-CAN-type package seals a semiconductor laser element in an airtight manner through resistance welding of a stem with a cylindrical cap to which a lens is attached. Front-surface light from the semiconductor laser element is condensed to an end face of an optical fiber through the lens. Accordingly, the front-surface light from the semiconductor laser element is coupled with a waveguide of the optical fiber so that optical signals can be transmitted.

The characteristics of the semiconductor laser element sensitively change with temperature. To stably transmit high-quality optical signals, the temperature of the semiconductor laser element is controlled to be constant by a thermoelectric cooler (TEC). The TEC is a thermoelectric module in which a heat-absorbing substrate and a heat-releasing substrate that are highly thermally conductive are attached to the respective ends of the Peltier element. The semiconductor laser element is connected on the heat-absorbing substrate side, and the stem is connected on the heat-releasing substrate side. The stem has a side surface in contact with an optical transceiver housing so that heat generated due to the operation of the TEC is released to the optical transceiver housing.

For example, the stem is made of cold milling steel, and the heat-releasing substrate and the heat-absorbing substrate of the TEC are each made of ceramic such as AlN or alumina. The heat-releasing substrate has a linear thermal expansion coefficient smaller than that of the stem. Accordingly, thermal deformation is restricted and thermal expansion is small at a surface of the stem in contact with the TEC, but thermal deformation is not restricted and thermal expansion is large at a surface of the stem opposite to the surface in contact with the TEC. Accordingly, warping occurs to the stem, and the position of the semiconductor laser element varies in the direction toward the stem. However, the position of the lens varies in the direction toward the optical fiber due to thermal expansion of the cap. As a result, the distance between the semiconductor laser element and the lens varies, and accordingly, the position of the condensation point of the front-surface light from the semiconductor laser element varies, and the efficiency of coupling to the optical fiber varies as well. Such variation of the efficiency of coupling to the optical fiber due to thermal deformation is referred to as tracking error.

To avoid tracking error, PTL 1 discloses a TO-CAN-type package in which an additional lens is provided between the semiconductor laser element on the TEC and the lens. This TO-CAN-type package reduces tracking error by generating collimated light as light emitted from the semiconductor laser element. Alternatively, a plastic plate may be provided between the semiconductor laser element on the TEC and the lens.

PRIOR ART

Patent Literature

[PTL 1] JP 2011-108937A

SUMMARY

Technical Problem

In the TO-CAN-type package disclosed in PTL 1, the position of the lens needs to be accurately fixed to generate collimated light, which leads to increase of assembly cost. When a plastic plate is housed inside the package, the length of the package is likely to be long in the optical axis direction.

The present invention is intended to solve the above-described problem and provide an optical module in which tracking error is easily reduced at low cost.

Means for Solving the Problems

According to a present invention, an optical module includes a stem including a first surface and a second surface opposite to the first surface, a thermoelectric cooler including a heat-releasing substrate fixed to the first surface, a semiconductor laser element attached to the thermoelectric cooler, a cap fixed to the first surface and covering the thermoelectric cooler and the semiconductor laser element, a lens fixed to the cap, and a restriction body fixed to the second surface, wherein the linear thermal expansion coefficients of the heat-releasing substrate and the restriction body are smaller than the linear thermal expansion coefficient of the stem.

According to another aspect of the present invention, an optical module includes a stem including a first surface, a second surface opposite to the first surface, and a side surface, a thermoelectric cooler including a heat-releasing substrate fixed to the first surface, a semiconductor laser element attached to the thermoelectric cooler, a cap fixed to the first surface and covering the thermoelectric cooler and the semiconductor laser element, a lens fixed to the cap, and a restriction body fixed to the side surface at a position closer to the second surface than the first surface, wherein the linear thermal expansion coefficients of the heat-releasing substrate and the restriction body are smaller than the linear thermal expansion coefficient of the stem.

Other features will be disclosed below.

Advantageous Effects of Invention

According to the present invention, it is possible to easily reduce tracking error at low cost by, for example, sandwich-

DESCRIPTION OF EMBODIMENTS

The following describes an optical module according to an embodiment of the present invention with reference to the accompanying drawings. Identical or corresponding components are denoted by an identical reference sign or an identical name, and duplicate description thereof will be omitted in some cases.

Embodiment 1

Figure 1:
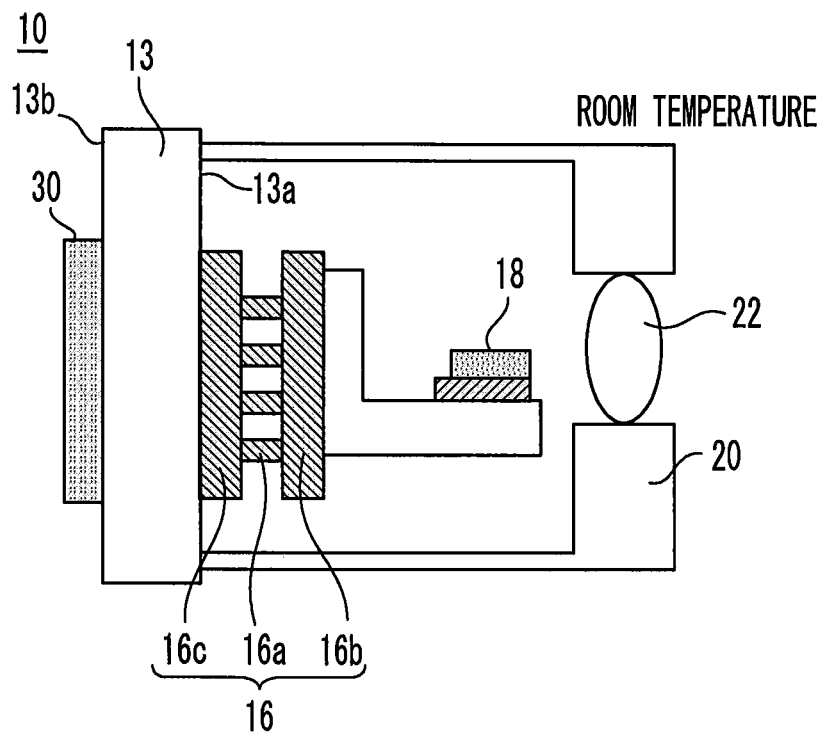
FIG. 1 is a cross-sectional view of an optical module according to Embodiment 1.

FIG. 1 is a cross-sectional view of an optical module 10 according to Embodiment 1. The optical module 10 includes a stem 13 including a first surface 13a and a second surface 13b opposite to the first surface 13a. A thermoelectric cooler 16 is provided to the first surface 13a of the stem 13. The thermoelectric cooler 16 is a thermoelectric cooler (TEC) in which a heat-absorbing substrate 16b and a heat-releasing substrate 16c are attached on the respective sides of a Peltier element 16a. The heat-releasing substrate 16c is fixed to the first surface 13a. The fixation method is not particularly limited but is, for example, soldering by using AuSn, SnAgCu, or the like. Alternatively, the fixation method may be welding.

A semiconductor laser element 18 is attached to the thermoelectric cooler 16 through a heat-releasing block or the like. Specifically, the semiconductor laser element 18 is attached to the heat-absorbing substrate 16b through a heat-releasing block or the like. The semiconductor laser element 18 is, for example, a laser diode. The temperature of the semiconductor laser element 18 is adjusted by the thermoelectric cooler 16.

A cap 20 is fixed to the first surface 13a. The cap 20 covers the thermoelectric cooler 16 and the semiconductor laser element 18. A lens 22 is fixed to the cap 20. The lens 22 condenses light emitted from the semiconductor laser element 18. The semiconductor laser element 18 can be sealed in an airtight manner by fixing the cap 20 holding the lens 22 to the first surface 13a of the stem 13 by, for example, resistance welding.

A restriction body 30 is fixed to the second surface 13b. The fixation method is not particularly limited but is, for example, soldering by using AuSn, SnAgCu, or the like. Alternatively, the fixation method may be welding. The restriction body 30 is, for example, a metal having a plate shape. The linear thermal expansion coefficients of the restriction body 30 and the heat-releasing substrate 16c are smaller than the linear thermal expansion coefficient of the stem 13. The restriction body 30, the heat-releasing substrate 16c, and the stem 13 may be each made of any material that satisfies this relation among the linear thermal expansion coefficients. The linear thermal expansion coefficient of the restriction body 30 is preferably smaller than the linear thermal expansion coefficient of the heat-releasing substrate 16c.

A power supply lead pin penetrating through the stem 13 is provided to supply electrical power to the semiconductor laser element 18 and the thermoelectric cooler 16. An optical signal output from the semiconductor laser element 18 is maintained at high quality so that the temperature of the semiconductor laser element 18 is adjusted to be constant by the thermoelectric cooler 16.

Figure 2:
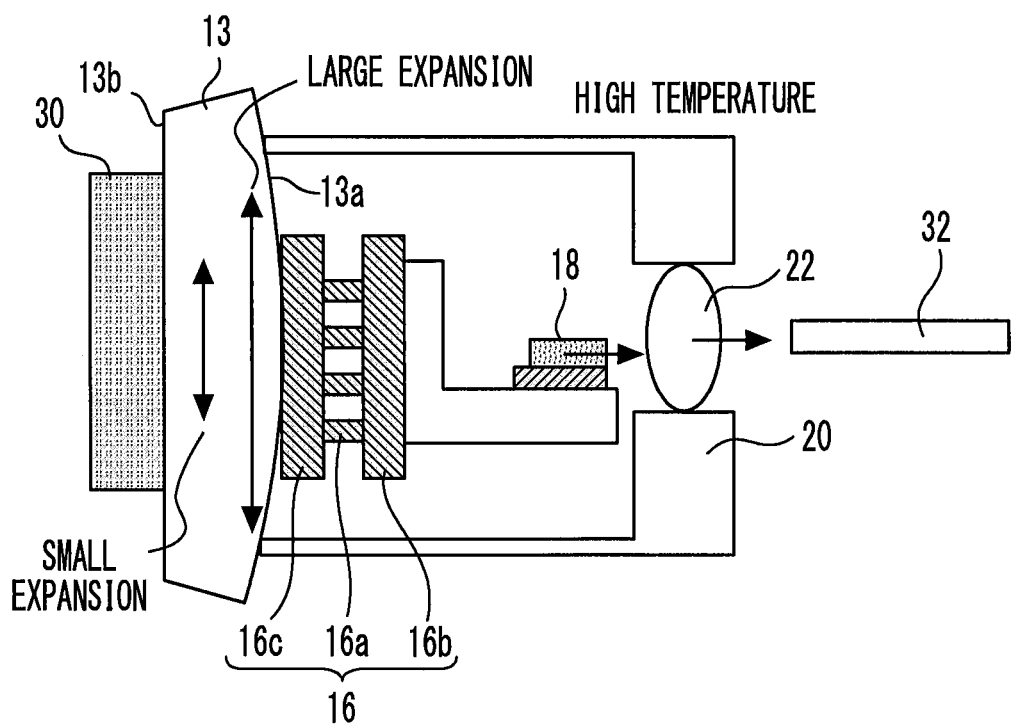
FIG. 2 is a cross-sectional view illustrating the optical module at high temperature.
Figure 3:
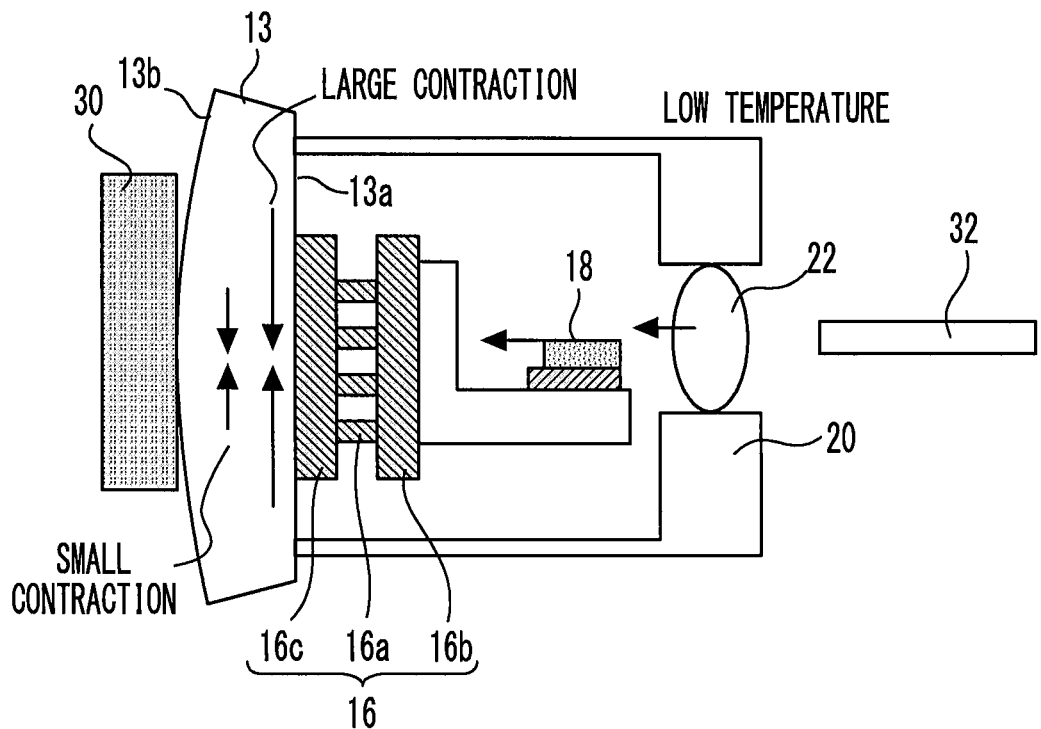
FIG. 3 is a cross-sectional view illustrating the optical module at low temperature.

FIG. 2 is a diagram illustrating the status of thermal deformation of the optical module 10 at high temperature. FIG. 3 is a diagram illustrating the status of thermal deformation of the optical module 10 at low temperature. FIGS. 2 and 3 relate to the optical module in which the linear thermal expansion coefficient of the heat-releasing substrate 16c is smaller than the linear thermal expansion coefficient of the stem 13 and the linear expansion coefficient of the restriction body 30 is smaller than the linear thermal expansion coefficient of the heat-releasing substrate 16c. FIGS. 2 and 3 illustrate an optical fiber 32 coupled with a laser beam from the semiconductor laser element 18.

As illustrated in FIG. 2, thermal expansion of the stem 13 is restricted by both the restriction body 30 and the heat-releasing substrate 16c, but the restriction body 30 exerts larger force of restricting thermal expansion than the heat-releasing substrate 16c. Thus, thermal expansion of the second surface 13b is smaller than thermal expansion of the first surface 13a, and the stem 13 warps in a convex manner projecting toward the cap 20 side. Accordingly, the position of the semiconductor laser element 18 varies in the direction toward the optical fiber 32. In addition, the position of the lens 22 varies in the direction toward the optical fiber 32 due to thermal expansion of the cap 20, and thus variation of the distance between the semiconductor laser element 18 and the lens 22 due to thermal deformation can be reduced.

The following describes FIG. 3 illustrating thermal deformation of the optical module 10 at low temperature. The restriction body 30 exerts larger force to restrict heat contraction of the stem 13 than the heat-releasing substrate 16c, and thus the stem 13 warps in a convex manner projecting toward the restriction body 30 side. Accordingly, the position of the semiconductor laser element 18 varies in the direction toward the stem 13. In addition, the position of the lens 22 varies in the direction toward the stem 13 due to heat contraction of the cap 20, and thus variation of the distance between the semiconductor laser element 18 and the lens 22 due to thermal deformation can be reduced.

In the optical module 10 according to Embodiment 1, the heat-releasing substrate 16c is attached to the first surface 13a of the stem 13 and the restriction body 30 is attached to the second surface 13b, thereby reducing variation of the distance between the semiconductor laser element 18 and the lens 22 due to thermal deformation. Accordingly, variation of the position of the light condensation point can be reduced, and thus tracking error can be reduced.

The optical module 10 according to Embodiment 1 can be modified in various manners within characteristics thereof. The linear thermal expansion coefficients of the restriction body 30 and the heat-releasing substrate 16c need to be smaller than the linear thermal expansion coefficient of the stem 13. However, the linear thermal expansion coefficients of the restriction body 30 and the heat-releasing substrate 16c may be equal to each other. Alternatively, the linear thermal expansion coefficient of the restriction body 30 may be larger than the linear thermal expansion coefficient of the heat-releasing substrate 16c. In these cases as well, tracking error can be reduced as compared to a configuration in which the restriction body 30 is not provided.

The stem 13 may be made of, for example, cold milling steel such as SPCC. The heat-releasing substrate 16c may be made of, for example, aluminum nitride, in other words, AlN, or alumina. The restriction body 30 may be made of, for example, aluminum nitride, alumina, kovar, or invar. With these materials, the linear thermal expansion coefficient of the restriction body 30 is equal to or smaller than the linear thermal expansion coefficient of the heat-releasing substrate 16c, and the linear thermal expansion coefficient of the stem 13 is larger than the linear thermal expansion coefficients of the restriction body 30 and the heat-releasing substrate 16c. When the restriction body 30 is made of AlN or alumina, thermal conductivity of the restriction body 30 is higher than thermal conductivity of the stem 13, thereby preventing degradation of the heat-releasing characteristic of a product due to attachment of the restriction body 30. These materials are exemplary.

Optical modules according to embodiments below are similar to that of Embodiment 1, and thus the following mainly describes difference thereof from that of Embodiment 1.

Embodiment 2

Figure 4:
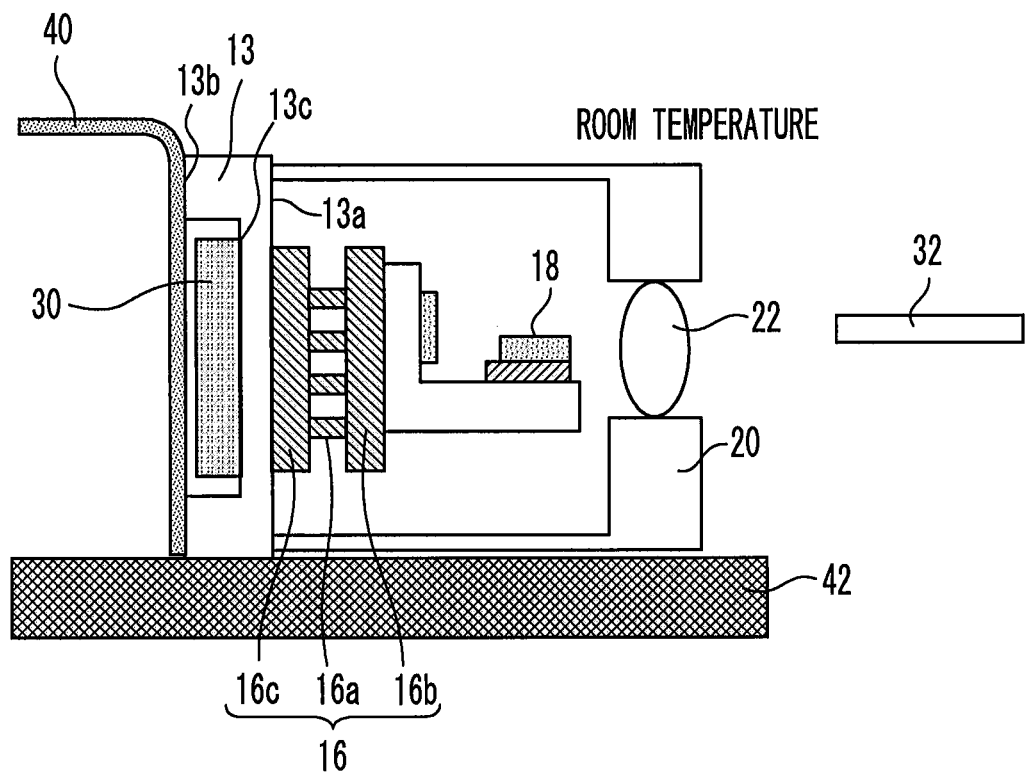
FIG. 4 is a cross-sectional view of an optical module according to Embodiment 2.

FIG. 4 is a cross-sectional view of an optical module according to Embodiment 2. A recess 13c is formed at the second surface 13b. The restriction, body 30 is provided in the recess 13c. The restriction body 30 is fixed to the recess 13c by, for example, welding. The restriction body 30, which is housed in the recess 13c, is positioned between the first surface 13a and the second surface 13b.

A flexible substrate 40 is fixed to the second surface 13b of the stem 13. The flexible substrate 40 includes a high-frequency line and transmits an input electric signal to the semiconductor laser element 18 and the thermoelectric cooler 16. The stem 13 has a side surface in contact with an optical transceiver housing 42. Accordingly, heat generated through the operation of the thermoelectric cooler 16 is released to the optical transceiver housing 42.

Figure 5:
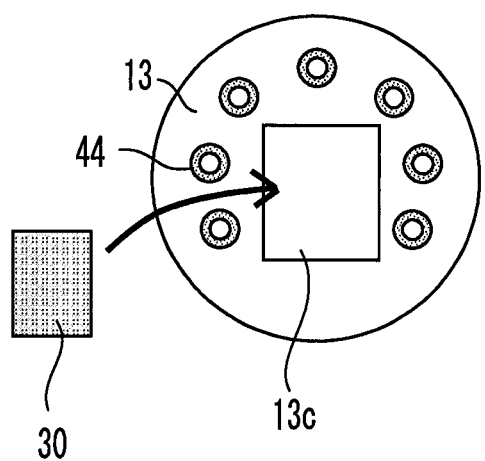
FIG. 5 is a bottom view of the stem and another portion.

FIG. 5 is a bottom view of the stem 13 of the optical module according to Embodiment 2. The recess 13c described above is formed at the center of the stem 13. A lead pin 44 used for power supply to the semiconductor laser element 18 and the thermoelectric cooler 16 is fixed to the stem 13. The lead pin 44 penetrates around the recess 13c through the stem 13. Accordingly, the lead pin 44 is provided at a position different from that of the recess 13c. The area and thickness of the restriction body 30 are desirably larger than those of the heat-releasing substrate 16c. The size of the recess 13c is determined to house the restriction body 30 having such area and thickness.

The flexible substrate 40 is electrically connected with the lead pin 44 to transmit an input electric signal to the semiconductor laser element 18 and the thermoelectric cooler 16.

When a flexible substrate is provided in the optical module illustrated in FIG. 1, the flexible substrate needs to be provided at the lower surface of the restriction body 30, and accordingly, the distance between the flexible substrate and the stem 13 increases as compared to a case in which the flexible substrate is directly fixed to the second surface 13b. As a result, the configuration in FIG. 1 needs to be newly designed.

However, in the optical module illustrated in FIG. 4, since the restriction body 30 is provided in the recess 13c of the stem 13, the gap between the flexible substrate 40 and the stem 13 can be made equivalent to that in a conventional product including no restriction body 30. Thus, a high-frequency line from the stem 13 to the flexible substrate 40 can be designed with an impedance equivalent to that of the conventional product, thereby avoiding degradation of the high-frequency characteristic. In addition, similarly to the conventional product, the side surface of the stem 13 can be provided in contact with the optical transceiver housing 42 to allow heat-releasing to the housing 42 by a method similar to that of the conventional product. As a result, the heat-releasing characteristic is not degraded by providing the restriction body 30 and the flexible substrate 40.

Similarly to the restriction body 30, the heat-releasing substrate 16c is attached to the stem 13 at a part where the lead pin 44 is not provided. Accordingly, the area of the restriction body 30 can be designed to be equivalent to the area of the heat-releasing substrate 16c. The thickness of the stem 13 is, for example, 1.2 mm to 1.3 mm approximately, and the thickness of the heat-releasing substrate 16c is, for example, 0.2 mm approximately. In this case, the thickness of the restriction body 30 provided in the recess 13c can be easily designed to be equivalent to or larger than the thickness of the heat-releasing substrate 16c. In this example, the depth of the recess 13c is 0.2 mm or larger, and the restriction body 30 having a thickness of 0.2 mm or larger is provided in the recess 13c.

As described above, the area and thickness of the restriction body 30 can be made equivalent to or larger than the area and thickness of the heat-releasing substrate 16c. When the linear thermal expansion coefficient of the restriction body 30 is same as the linear thermal expansion coefficient of the heat-releasing substrate 16c, the warping of the stem is reduced at least as compared to a case in which no restriction body is provided. In addition, when the linear thermal expansion coefficient of the restriction body 30 is smaller than the linear thermal expansion coefficient of the heat-releasing substrate 16c, the directions of variation of the semiconductor laser element 18 and the position of the lens 22 due to thermal deformation can be same as described in Embodiment 1.

In this manner, in the optical module according to Embodiment 2, since the recess 13c is provided to the stem 13 and the restriction body 30 is embedded in the recess 13c, tracking error can be reduced while the high-frequency characteristic and the heat-releasing characteristic equivalent to those of the conventional product are maintained.

Embodiment 3

Figure 6:
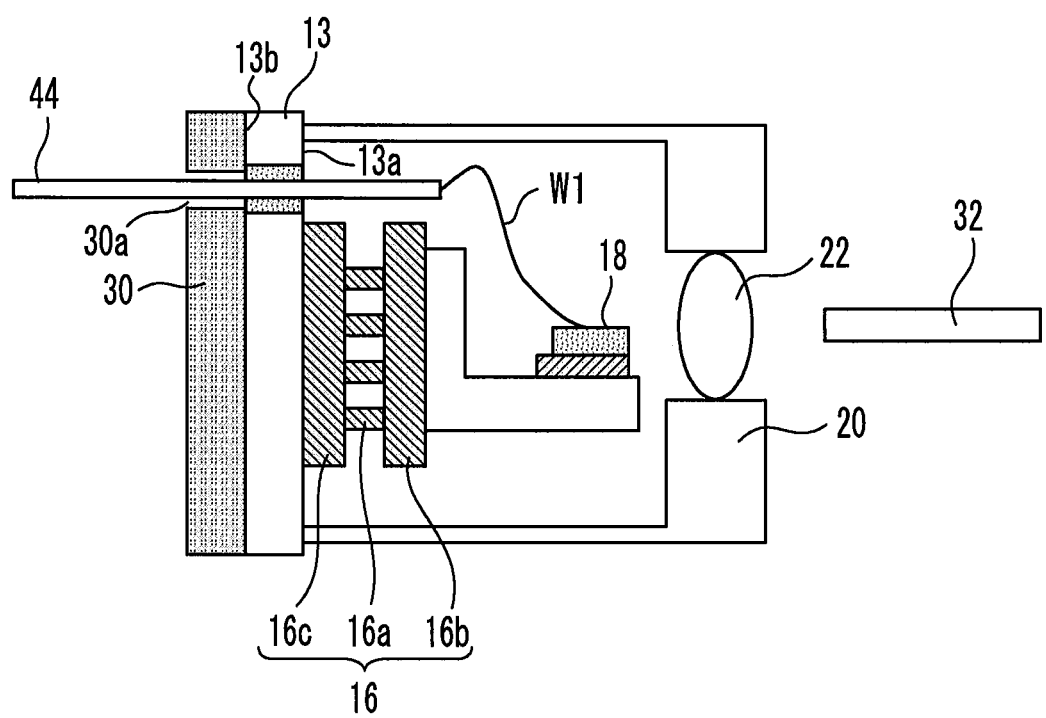
FIG. 6 is a cross-sectional view of an optical module according to Embodiment 3.

FIG. 6 is a cross-sectional view of an optical module according to Embodiment 3. This optical module includes the lead pin 44 penetrating through the stem 13. In addition, a through-hole 30a through which the lead pin 44 penetrates is formed at the restriction body 30. Accordingly, the area of the restriction body 30 can be increased to increase the contact area of the restriction body 30 and the stem 13. For example, the contact area of the restriction body 30 and the second surface 13b can be larger than the contact area of the heat-releasing substrate 16c and the first surface 13a. When the contact areas of the restriction body 30 and the stem 13 are large, force exerted by the restriction body 30 to restrict thermal deformation of the stem 13 is increased. Accordingly, warping larger than that of the stem according to Embodiment 1 or 2 occurs to the stem 13 of the optical module according to Embodiment 3 at high temperature or low temperature, and the amount of change of the position of the semiconductor laser element 18 due to thermal deformation is increased.

For example, when the stem 13 is made of cold milling steel and the cap 20 is made of stainless steel, the difference between the linear thermal expansion coefficients of both members is reduced to 12 ppm approximately. In addition, when the length of the cap 20 in the optical axis direction is, for example, 5 mm to 6 mm and the length of the stem 13 in the optical axis direction is 1.2 mm to 1.3 mm, the length of the cap 20 in the optical axis direction is longer than the length of the stem 13 in the optical axis direction, and thus the amount of thermal expansion of the cap 20 is larger than the amount of thermal expansion of the stem 13. In this case, the amount of change of the position of the lens 22 due to thermal deformation is larger than the amount of change of the position of the semiconductor laser element 18 under the same condition.

As described above, when the restriction body 30 is attached to the stem 13, the positional variation directions of the semiconductor laser element 18 and the position of the lens 22 can be same. However, the amount of position change is larger at the lens 22 than the semiconductor laser element 18. In Embodiment 3, the amount of change of the position of the semiconductor laser element 18 can be increased by increasing the area of the restriction body 30, thereby reducing the amount of change of the relative positions of the semiconductor laser element 18 and the lens 22. As a result, tracking error can be further reduced.

Embodiment 4

Figure 7:
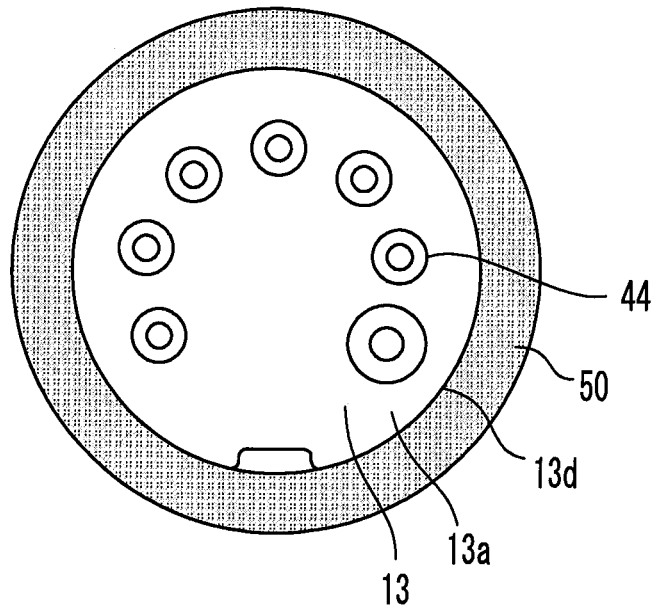
FIG. 7 is a plan view of a restriction body and another portion according to Embodiment 4.
Figure 8:
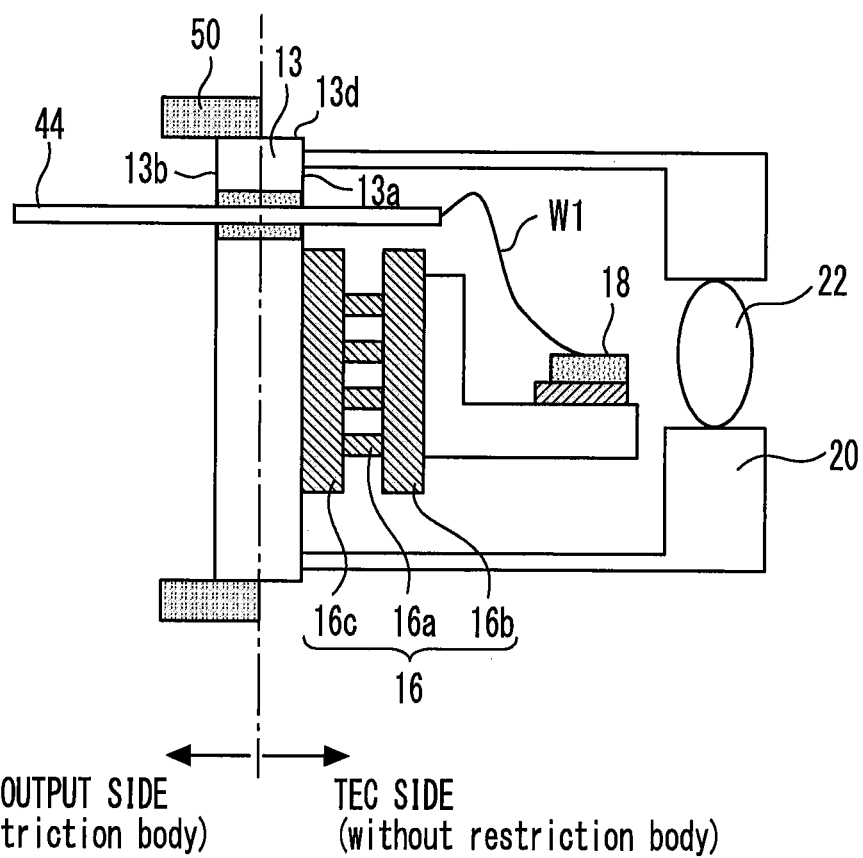
FIG. 8 is a cross-sectional view of an optical module according to Embodiment 4.

FIG. 7 is a plan view of the stem and other components of an optical module according to Embodiment 4. A restriction body 50 is fixed to a side surface 13d of the stem 13. The restriction body 50 is annular in plan view. FIG. 8 is a cross-sectional view of the optical module according to Embodiment 4. The dashed and single-dotted line represents the center line of the stem 13. The center line is positioned between the first surface 13a and the second surface 13b. The restriction body 50 is fixed to the side surface 13d at a position closer to the second surface 13b than the first surface 13a. In other words, the restriction body 50 is attached to cover a lead-pin output side of the side surface 13d of the stem 13 but is not attached on the thermoelectric cooler 16 side. Accordingly, the restriction body 50 is provided on the second surface 13b side of the dashed and single-dotted line. The linear thermal expansion coefficients of the heat-releasing substrate 16c and the restriction body 50 are smaller than the linear thermal expansion coefficient of the stem 13.

Figure 9:
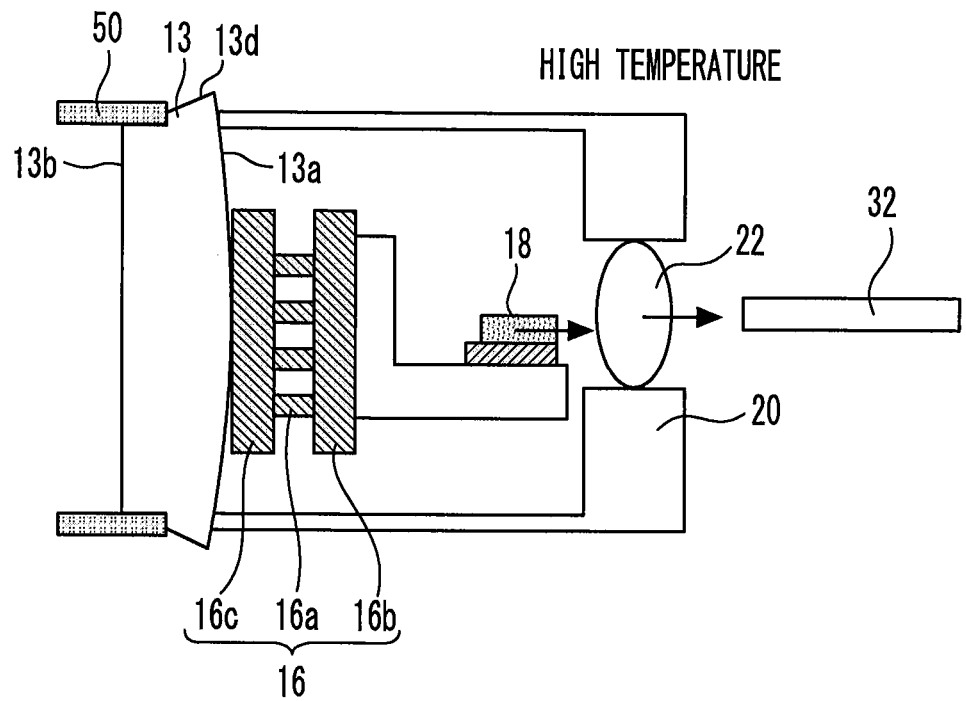
FIG. 9 is a cross-sectional view illustrating the optical module at high temperature.

At high temperature or low temperature, the restriction body 50 restricts thermal expansion and contraction of the lead-pin output side of the stem 13, thereby making it possible to generate warping of the stem 13 in a direction same as that in Embodiment 1. Thus, tracking error is reduced. FIG. 9 is a cross-sectional view of the optical module according to Embodiment 4 at high temperature. As illustrated in FIG. 9, the stem 13 largely expands on the first surface 13a side, but the expansion on the second surface 13b side is restricted by the restriction body 50. In this manner, in addition to the tracking-error reduction effect, the optical module according to Embodiment 4 needs no special fabrication such as formation of a recess at the stem 13, thereby avoiding increase in the cost of the stem 13.

The restriction body 50 in FIG. 8 can be modified in various manners as long as the restriction body 50 is fixed to the side surface 13d on the second surface side of a middle position at which the distance from the first surface 13a is equal to the distance from the second surface 13b. For example, the contact area of the restriction body and the stem may be smaller than that in the case of FIG. 8.

Embodiment 5

Figure 10:
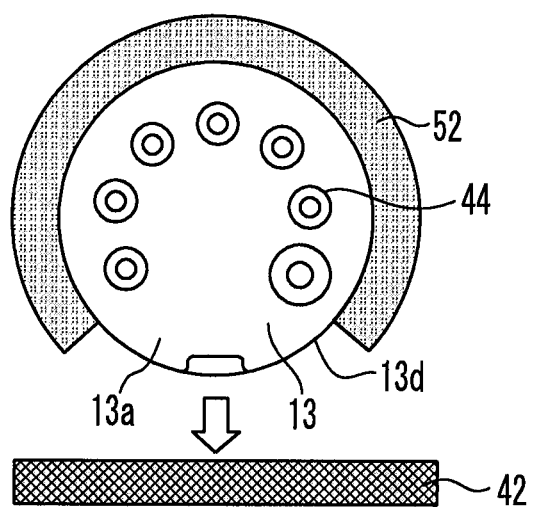
FIG. 10 is a diagram illustrating a restriction body and other components according to Embodiment 5.

FIG. 10 is a diagram illustrating a restriction body and other components according to Embodiment 5. A restriction body 52 is semicircular and provided to the side surface 13d of the stem 13. As described in Embodiment 4, the restriction body 52 is fixed to the side surface 13d at a position closer to the second surface 13b than the first surface 13a. As illustrated in FIG. 10, the restriction body 52 does not cover the entire side surface of the stem 13 in plan view but covers part of the side surface 13d of the stem 13 in plan view. Part of the side surface 13d not covered by the restriction body 52 thermally contacts the optical transceiver housing 42. Accordingly, favorable heat-releasing from the optical module to the housing 42 is achieved while the restriction body 52 is attached.

Embodiment 6

Figure 11:
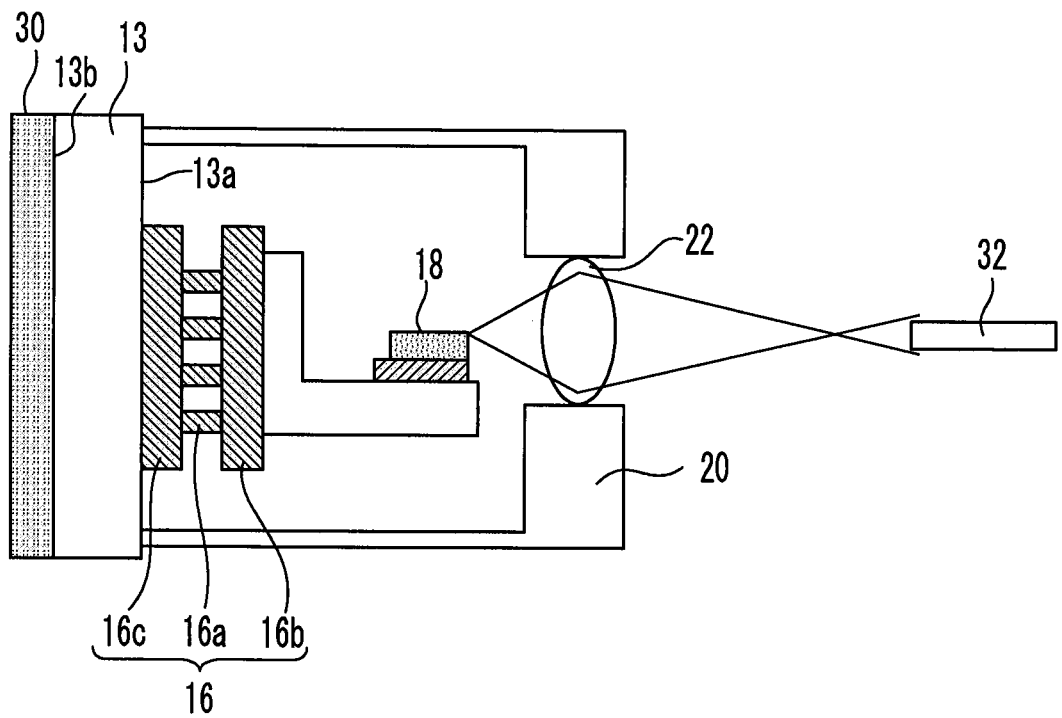
FIG. 11 is a cross-sectional view of an optical module according to Embodiment 6.

FIG. 11 is a cross-sectional view of an optical module according to Embodiment 6. An operation temperature range is determined for an optical module as a product. For example, a product configured to operate at −5° C. to 80° C. has a central temperature of 37.5° C. A product configured to operate at −40° C. to 95° C. has a central temperature of 27.5° C. For example, the central temperature of the operation temperature range of a product is adjusted to room temperature as ambient temperature of the product.

FIG. 11 illustrates the optical fiber 32 provided outside the cap 20 and facing the lens 22. Typically, an optical fiber is provided so that a coupling efficiency peak is obtained at the central temperature of the operation temperature range. However, the optical fiber 32 according to Embodiment 6 is provided at a position where the coupling efficiency peak is obtained at a temperature lower than the central temperature of the operation temperature. Specifically, the optical fiber 32 is defocused in the direction departing from the optical module and fixed.

Figure 12:
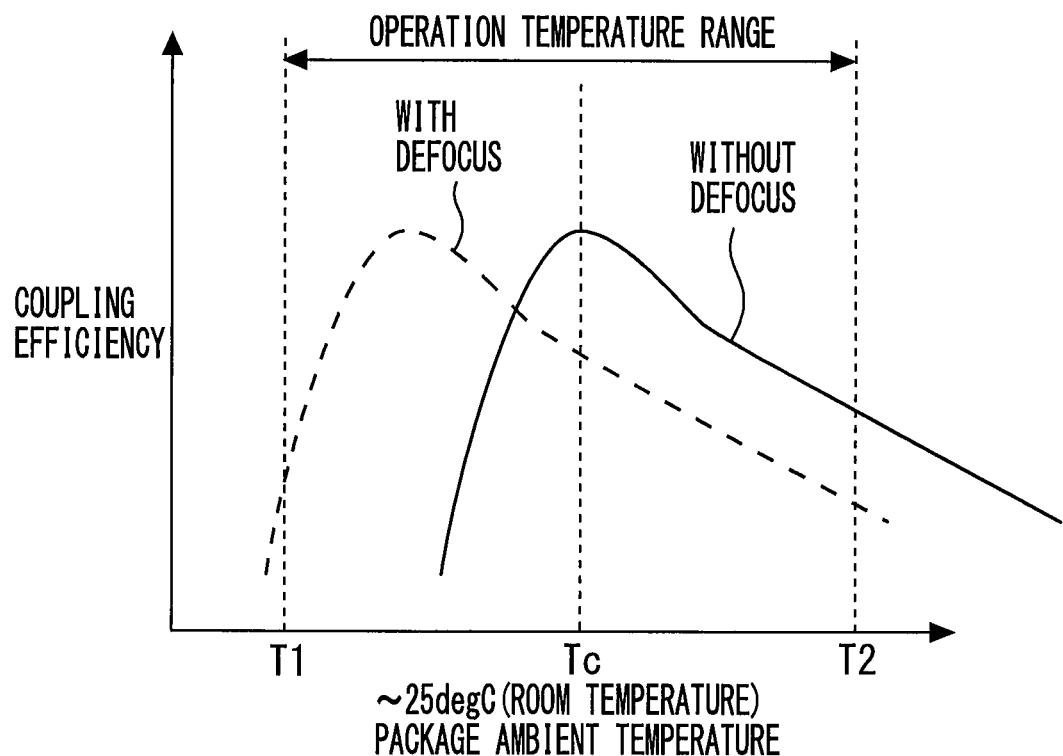
FIG. 12 is a diagram illustrating the relation between the package ambient temperature and the coupling efficiency.

FIG. 12 is a diagram illustrating the relation between the package ambient temperature and the coupling efficiency. T1 and T2 represent the lowest and highest temperatures of an assumed operation temperature range. Tc represents the central temperature of the operation temperature range. Tc is, for example, room temperature at 25° C. approximately. In a "without defocus" case illustrated with the solid line, the optical fiber is provided so that the coupling efficiency peak can be obtained at the central operation temperature Tc.

For example, when the strength of bonding between the stem 13 and the restriction body 30 is weak, force exerted by the restriction body 50 to restrict thermal deformation of the stem 13 decreases along with thermal contraction of the stem 13 at low temperature. As a result, at low temperature, the tracking-error reduction effect is small and change of the coupling efficiency due to change of the ambient temperature is large. Accordingly, decrease of the coupling efficiency is large at low temperature. As a result, in a "without defocus" case illustrated in FIG. 12, high coupling efficiency is obtained at the central temperature Tc, but the coupling efficiency abruptly decreases as temperature becomes lower than Tc.

Figure 13:
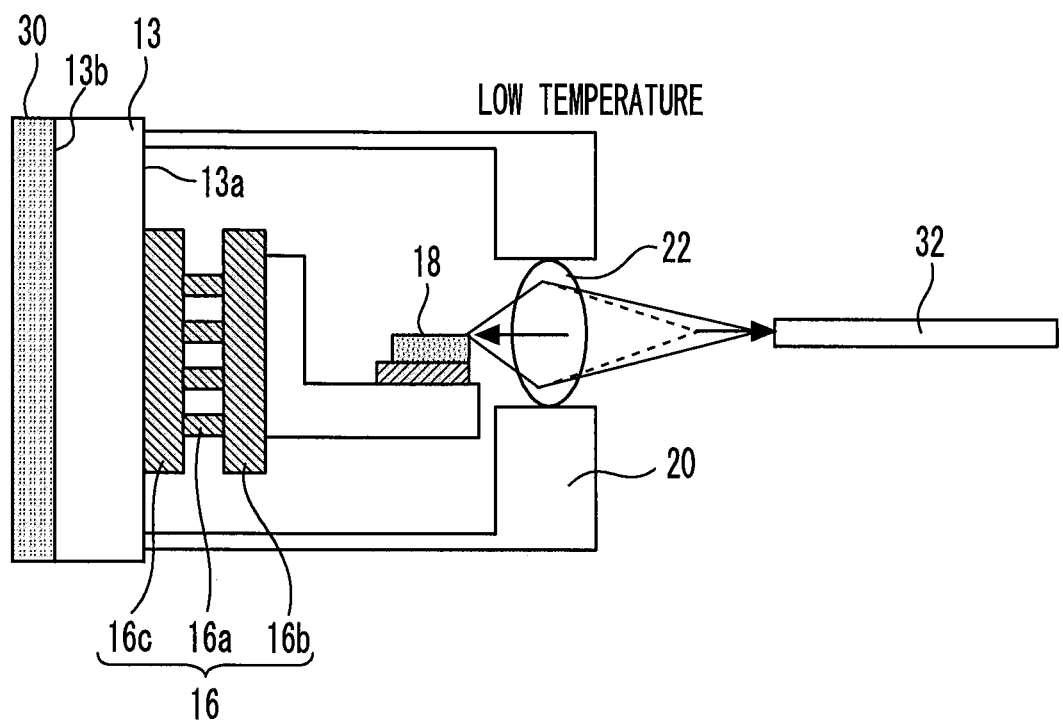
FIG. 13 is a cross-sectional view illustrating the optical module at low temperature.

A "with defocus" case illustrated with the dashed line in FIG. 12 corresponds to the relation between temperature and the coupling efficiency when the optical fiber 32 is defocused in the direction departing from the lens 22 and fixed. In the "with defocus" case, the optical fiber 32 is provided at a position where the coupling efficiency peak is obtained at a temperature lower than the central temperature Tc of the operation temperature. FIG. 13 is a cross-sectional view of the optical module when the ambient temperature is lower than Tc in the "with defocus" case. In this case, the cap 20 thermally contracts, and accordingly, the position of the lens 22 varies in the direction toward the stem 13. Along this, the position of the condensation point of light emitted from the semiconductor laser element 18 varies in the direction toward the optical fiber 32. Since the optical fiber 32 is defocused, the coupling efficiency increases at low temperature. As a result, the coupling efficiency peak is obtained at a temperature lower than Tc.

In the optical module according to Embodiment 6, the coupling efficiency peak is shifted to the low temperature side with taken into consideration the abrupt decrease of the coupling efficiency at low temperature, for example, when the strength of bonding between the stem 13 and the restriction body 30 is weak. Accordingly, coupling efficiency change that occurs in the entire operation temperature range can be reduced. In other words, tracking error can be reduced.

The coupling efficiency abruptly decreases at low temperature not only when the strength of bonding between the stem 13 and the restriction body 30 is weak but also, for example, when force that restricts thermal deformation of the stem is weak due to characteristics of the material of the restriction body. Thus, it is effective to adjust the position of the optical fiber in the optical axis direction as described above.

Features of the optical module according to each embodiment described above may be combined as appropriate to enhance the effect of the present invention.

DESCRIPTION OF SYMBOLS 10 optical module, 13 stem, 16 thermoelectric cooler, 18 semiconductor laser element, 20 cap, 22 lens

The invention claimed is:

1. An optical module comprising:
a stem including a first surface and a second surface opposite to the first surface;
a thermoelectric cooler including a heat-releasing substrate fixed to the first surface;
a semiconductor laser element attached to the thermoelectric cooler;
a cap fixed to the first surface and covering the thermoelectric cooler and the semiconductor laser element;
a lens fixed to the cap; and
a restriction body fixed to the second surface, wherein
the linear thermal expansion coefficients of the heat-releasing substrate and the restriction body are smaller than the linear thermal expansion coefficient of the stem,
the semiconductor laser element is configured to emit light directly to the lens,
the linear thermal expansion coefficient of the restriction body is smaller than the linear thermal expansion coefficient of the heat-releasing substrate,
the stem is made of SPCC,
the heat-releasing substrate is made of aluminum nitride or alumina,
the restriction body is made of aluminum nitride or invar, and
the restriction body restricts thermal deformation of the second surface side of the stem such that positions of the laser element and the lens:
vary in a same first direction upon thermal expansion of the stem, and
vary in a same second direction opposite to the first direction upon thermal contraction of the stem.

2. The optical module according to claim 1, comprising a lead pin penetrating through the stem, wherein a through-hole through which the lead pin penetrates is formed at the restriction body.

3. The optical module according to claim 2, wherein the contact area of the restriction body and the second surface is larger than the contact area of the heat-releasing substrate and the first surface.

* * * * *